(12) United States Patent
Miyazaki et al.

(10) Patent No.: US 7,495,464 B2
(45) Date of Patent: Feb. 24, 2009

(54) INSPECTION DEVICE OF A SEMICONDUCTOR DEVICE

(75) Inventors: Mitsuo Miyazaki, Kawasaki (JP);
Kazuhiko Shimabayashi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 44 days.

(21) Appl. No.: 11/401,893

(22) Filed: Apr. 12, 2006

(65) Prior Publication Data

US 2007/0171405 A1    Jul. 26, 2007

(30) Foreign Application Priority Data

Jan. 23, 2006   (JP) ............... 2006-014229

(51) Int. Cl.
*G01R 31/26* (2006.01)
(52) U.S. Cl. ................... 324/765; 324/158.1
(58) Field of Classification Search ........... 324/765
See application file for complete search history.

(56) References Cited

U.S. PATENT DOCUMENTS 5,534,786 A  *  7/1996  Kaneko et al. ............ 324/760
5,794,175 A  *  8/1998  Conner ...................... 702/119
6,323,669 B1 * 11/2001  Kang ......................... 324/765
6,452,411 B1 *  9/2002  Miller et al. ............... 324/765
6,499,121 B1 * 12/2002  Roy et al. .................. 714/724
6,747,473 B2 *  6/2004  Cowan ....................... 324/765
7,138,792 B2 * 11/2006  Fu et al. .................... 324/158.1

FOREIGN PATENT DOCUMENTS

JP    5-322971    12/1993
JP    6-148269    5/1994

* cited by examiner

*Primary Examiner*—Ha Tran T Nguyen
*Assistant Examiner*—Richard Isla Rodas
(74) *Attorney, Agent, or Firm*—Westerman, Hattori, Daniels & Adrian, LLP.

(57) ABSTRACT

An inspection device of a semiconductor device includes a socket where the semiconductor device is installed, and a measuring part configured to inspect an electrical property of the semiconductor device. A standard sample and the socket are provided in a body. A standard value of the standard sample is stored in the measuring part. Whether there is abnormality of the measuring part is determined by comparing a value of the standard sample measured by the measuring part and the standard value.

9 Claims, 9 Drawing Sheets

INSPECTION DEVICE OF A SEMICONDUCTOR DEVICE

BACKGROUND OF THE INVENTION

1. Field of the Invention

The present invention generally relates to inspection devices of semiconductor devices, and more specifically, to an inspection device of a semiconductor device provided in an IC socket, the inspection device being configured to inspect an electrical property of the semiconductor device.

2. Description of the Related Art

Conventionally, a method wherein measurement is implemented by using a standard sample so that whether abnormality is generated in an inspection device is determined before inspection or test of a semiconductor device such as a semiconductor integrated circuit (IC) starts, has been used.

Figure 1:
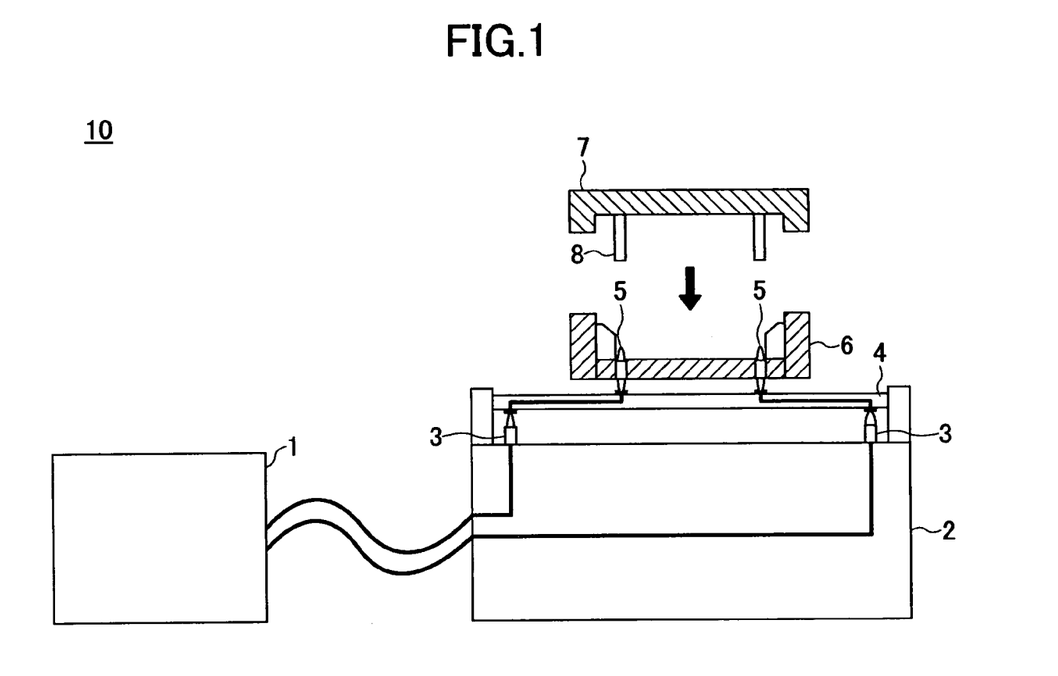
FIG. 1 is a schematic view showing a structure of a related art inspection device of a flat type package semiconductor device.

FIG. 1 is a schematic view showing a structure of a related art inspection device of a flat type package semiconductor device.

Referring to FIG. 1, the related art inspection device 10 of a flat type package semiconductor device includes a tester 1, a test head 2, a printed circuit board 4, an IC socket main body part 6, an IC socket lid part 5, and others.

The test head 2 is connected to the tester 1 via a wiring. The printed circuit board 4 is connected to the test head 2 via first pogo pins 3 in an upper part of the test head 2. The IC socket main body part 6 is connected to the printed circuit board 4 via second pogo pins 5 on the printed circuit board 4. The IC socket lid part 7 is provided above the IC socket main body part 6 so as to cover the IC socket main body part 6.

The corresponding first pogo pins 3 and second pogo pins 5 are connected to each other via wiring and terminals of the printed circuit board 4. Furthermore, semiconductor device supporting parts 8 are formed from an inside lower surface of the IC socket lid part 7 in a perpendicular direction.

Figure 2:
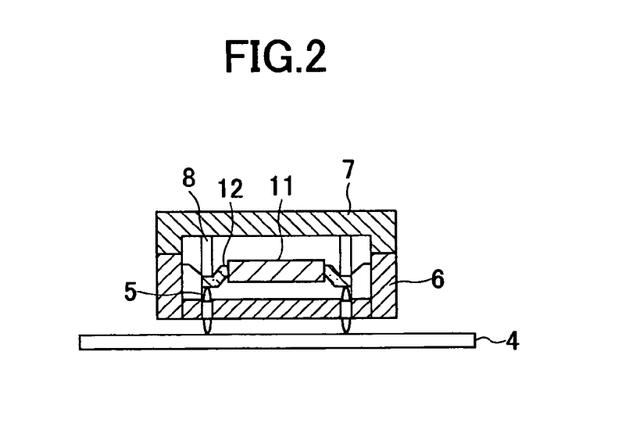
FIG. 2 is cross-sectional view showing a main part of the related art inspection device shown in FIG. 1 in a state where the flat type package semiconductor device is installed in the inspection device.

FIG. 2 is cross-sectional view showing a main part of the related art inspection device 10 shown in FIG. 1 in a state where the flat type package semiconductor device is installed in the inspection device 10.

Referring to FIG. 2, leads 12 of a semiconductor device 11 are provided on the second pogo pins 5 provided on the IC socket main body part 6. The leads 12 are supported by the corresponding semiconductor supporting parts 8 of the IC socket lid part 7 from upper parts of the leads 12.

Therefore, the semiconductor device 11 can be electrically connected to the test head 2 by the second pogo pins 5, the printed circuit board 4 and the first pogo pins 3 shown in FIG. 1 and can be electrically connected to the tester 1 via the wiring.

Figure 3:
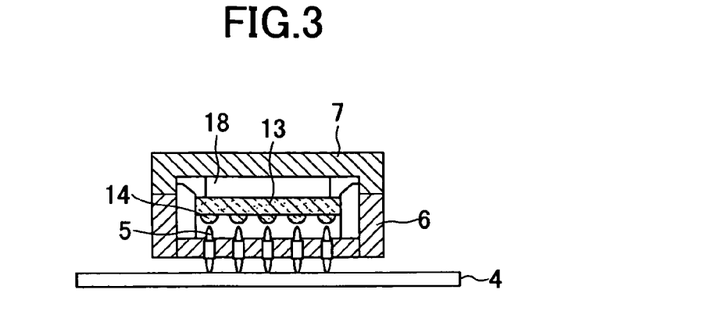
FIG. 3 is cross-sectional view showing a main part of a related art inspection device of an area type package semiconductor device in a state where the area type package semiconductor device is installed in the inspection device.

In addition, in a case where the semiconductor device is an area type package semiconductor device, a structure shown in FIG. 3 can be applied to a main part of the inspection device.

Here, FIG. 3 is a cross-sectional view showing a main part of a related art inspection device of an area type package semiconductor device in a state where the area type package semiconductor device is installed in the inspection device.

Referring to FIG. 3, a large number of connection terminals 14 formed on a lower surface of the area type package semiconductor device 13 correspond to positions of the second pogo pins 5 in the IC socket main body 6. Under this structure, the semiconductor device 13 is supported from an upper part of the semiconductor device 13 by the semiconductor device supporting parts 18 of the IC socket lid part 7.

Therefore, the semiconductor device 13 can be electrically connected to the test head 2 by the second pogo pins 5, the printed circuit board 4 and the first pogo pins 3 shown in FIG. 1 and can be electrically connected to the tester 1 via the wiring.

In the inspection devices shown in FIG. 1 through FIG. 3, a designated standard sample, instead of the semiconductor device 11 and the semiconductor device 13, can be installed. In the related art, prior to starting of inspection or test of the semiconductor device, the standard sample is measured by the inspection device shown in FIG. 1 through FIG. 3.

A data measured value of the standard sample obtained by measurement and a data standard value of a standard sample obtained previously and maintained are compared, so that whether abnormality of the inspection device 10 is generated is determined. Based on the determination that the abnormality of the inspection device 10 is not generated, the standard sample is exchanged for the semiconductor device 11 or 13 being an actual body to be inspected so that the inspection or test of the semiconductor device is started.

Furthermore, a method is disclosed in Japanese Laid-Open Patent Application Publication No. 6-148269 wherein, in a wiring test of a printed circuit board, wire test pattern data from a file are applied to the printed circuit board, and in a tester, an output of the printed circuit board is compared with the results of simulation stored in the file in performing the wiring test of the printed circuit board.

In addition, a socket type IC test device is disclosed in Japanese Laid-Open Patent Application Publication No. 5-322971. In the device, leads corresponding to each socket probe in a socket are provided, a test IC connected to a resistor of a certain value or directly contacted is provided in between each specific lead and another lead, and means for pushing the lead of the test IC to the socket probe are provided. A contact status measurement circuit is provided which impresses a voltage in turn between a specific socket probe contacting a specific lead of the IC and another socket probe contacting another lead, measures the resistance values of the socket probes, compares them with a standard value and outputs the signal exceeding the standard value, and outputs the signals below or above the standard value.

However, in the above-discussed related art inspection device of the semiconductor device, the standard sample is prepared and the data measured value of the standard sample obtained by measurement and the data standard value of the standard sample obtained previously and maintained are compared. When it is determined that the abnormality of the inspection device is not generated, the standard sample is exchanged for the semiconductor device being an actual body to be inspected so that the inspection or test of the semiconductor device is started. Therefore, a lot of complex processes are required for these operations.

In addition, in a case where the generation of the abnormality is found, a complex operation is necessary for determining whether the reason of the abnormality is caused by a bad connection between the IC socket and the standard sample or by a problem on the side of the measuring device such as a measuring circuit or measuring device (tester).

Furthermore, since the standard sample and the standard sample data are provided in positions separated from each other, an error in maintaining the standard sample and the standard sample data may occur or an error of comparison between the data obtained by measuring the standard sample and the standard sample data obtained previously and maintained may occur.

SUMMARY OF THE INVENTION

Accordingly, the present invention may provide a novel and useful inspection device of a semiconductor device solving one or more of the problems discussed above.

Another and more specific object of the present invention may be to provide an inspection device of a semiconductor device whereby a standard sample and the semiconductor device can be easily and surely measured and inspected.

The above object of the present invention is achieved by an inspection device of a semiconductor device, including:

a socket where the semiconductor device is installed; and a measuring part configured to inspect an electrical property of the semiconductor device;

wherein a standard sample and the socket are provided in a body;

a standard value of the standard sample is stored in the measuring part; and whether there is abnormality of the measuring part is determined by comparing a value of the standard sample measured by the measuring part and the standard value.

The inspection device of the semiconductor device may further include a standard sample board where the standard sample is mounted. The standard sample board and the socket may be unified. The standard sample board may be electrically connected to the measuring part.

The value of the standard sample measured by the measuring part and the standard value of the standard sample stored in the measuring part may be compared by implementing an inspection program provided in the measuring part.

According to an embodiment of the present invention, it is possible to provide the inspection device of the semiconductor device whereby the standard sample and the semiconductor device can be easily and surely measured and inspected.

Other objects, features, and advantages of the present invention will be come more apparent from the following detailed description when read in conjunction with the accompanying drawings.

DETAILED DESCRIPTION OF THE PREFERRED EMBODIMENTS

A description is given below, with reference to the FIG. 4 through FIG. 12 of embodiments of the present invention.

Figure 4:
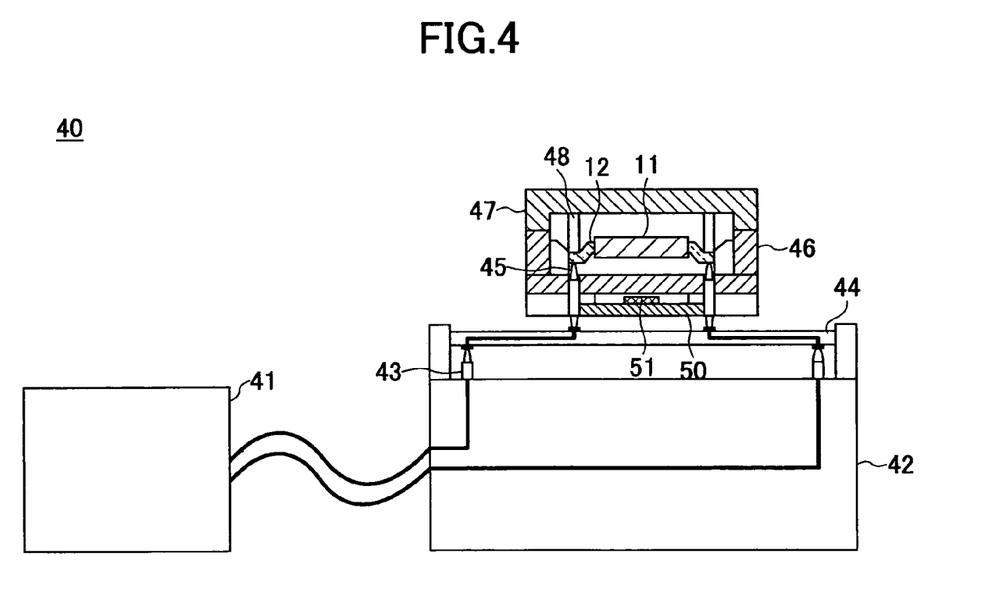
FIG. 4 is a schematic view showing a structure of an inspection device of a flat type package semiconductor device, of an embodiment of the present invention.

FIG. 4 is a schematic view showing a structure of an inspection device of a flat type package semiconductor device, of an embodiment of the present invention.

Referring to FIG. 4, an inspection device 40 of a flat type package semiconductor device 11 includes a tester 41, a test head 42, a printed circuit board 44, an IC socket main body part 46, an IC socket lid part 47, and others.

The tester 41 works as a measuring part. The test head 42 is connected to the tester 41 via a wiring. The printed circuit board 44 is connected to the test head 42 via first pogo pins 43 in an upper part of the test head 42. The IC socket main body part 46 is connected to the printed circuit board 44 via second pogo pins 45 on the printed circuit board 44. The IC socket lid part 47 is provided above the IC socket main body part 46 so as to cover the IC socket main body part 46.

The corresponding first pogo pins 43 and second pogo pins 45 are connected to each other via wiring and terminals of the printed circuit board 44. Furthermore, semiconductor device supporting parts 48 are formed from an inside lower surface of the IC socket lid part 47 in a perpendicular direction.

Leads 12 of the semiconductor device 11 are provided on the second pogo pins 45 provided in the IC socket main body part 46. The leads 12 are supported by the semiconductor supporting parts 48 of the IC socket lid part 47 contacting the upper parts of the leads 12.

In addition, the standard sample 51, which is an element formed by dicing a semiconductor wafer is mounted on the main surface of the standard sample board 50. The standard sample board 50 is provided between the IC socket main body 46 and the print circuit board 44. In other words, in the inspection device 40 of the flat type package semiconductor device of the embodiment of the present invention, the IC socket main body part 46 containing the semiconductor device 11 and the standard sample board 50 on which the standard sample 51 is mounted are joined (unified). Meanwhile, since the IC socket main body 46 is a consumable item, the IC socket main body 46 can be optionally changed.

Under this structure, the semiconductor device 11 and the standard sample 51 can be electrically connected to the test head 42 by the second pogo pins 45, the printed circuit board 44 and the first pogo pins 43. In addition, the semiconductor device 11 and the standard sample 51 can be electrically connected to the tester 41 via the wiring, so that measuring can be performed by the tester 41.

Figure 8:
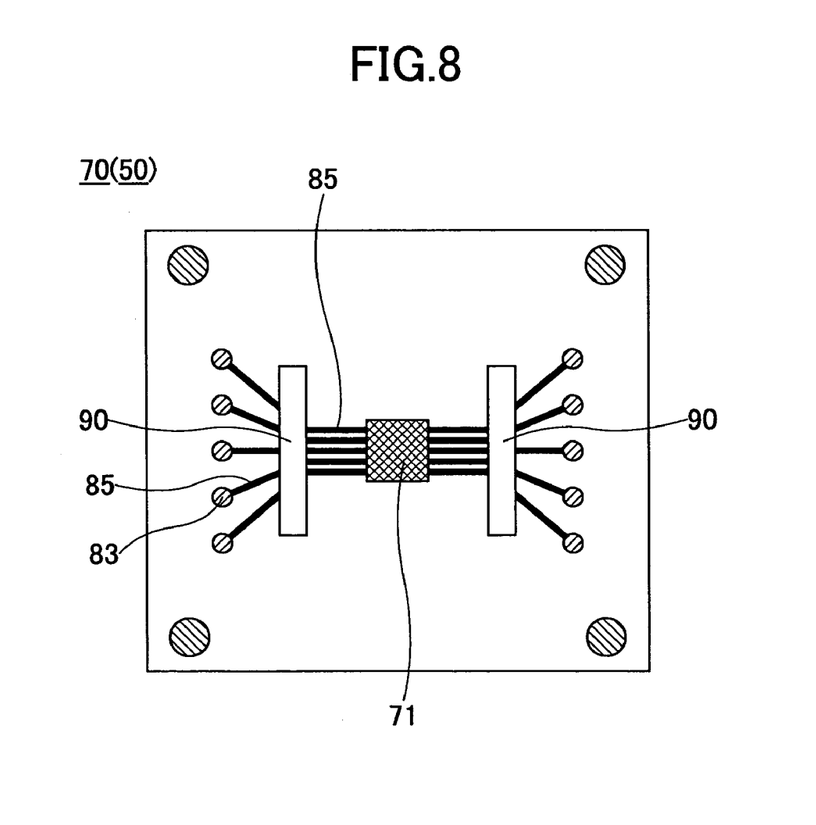
FIG. 8 is a plan view of the standard sample board.
Figure 9:
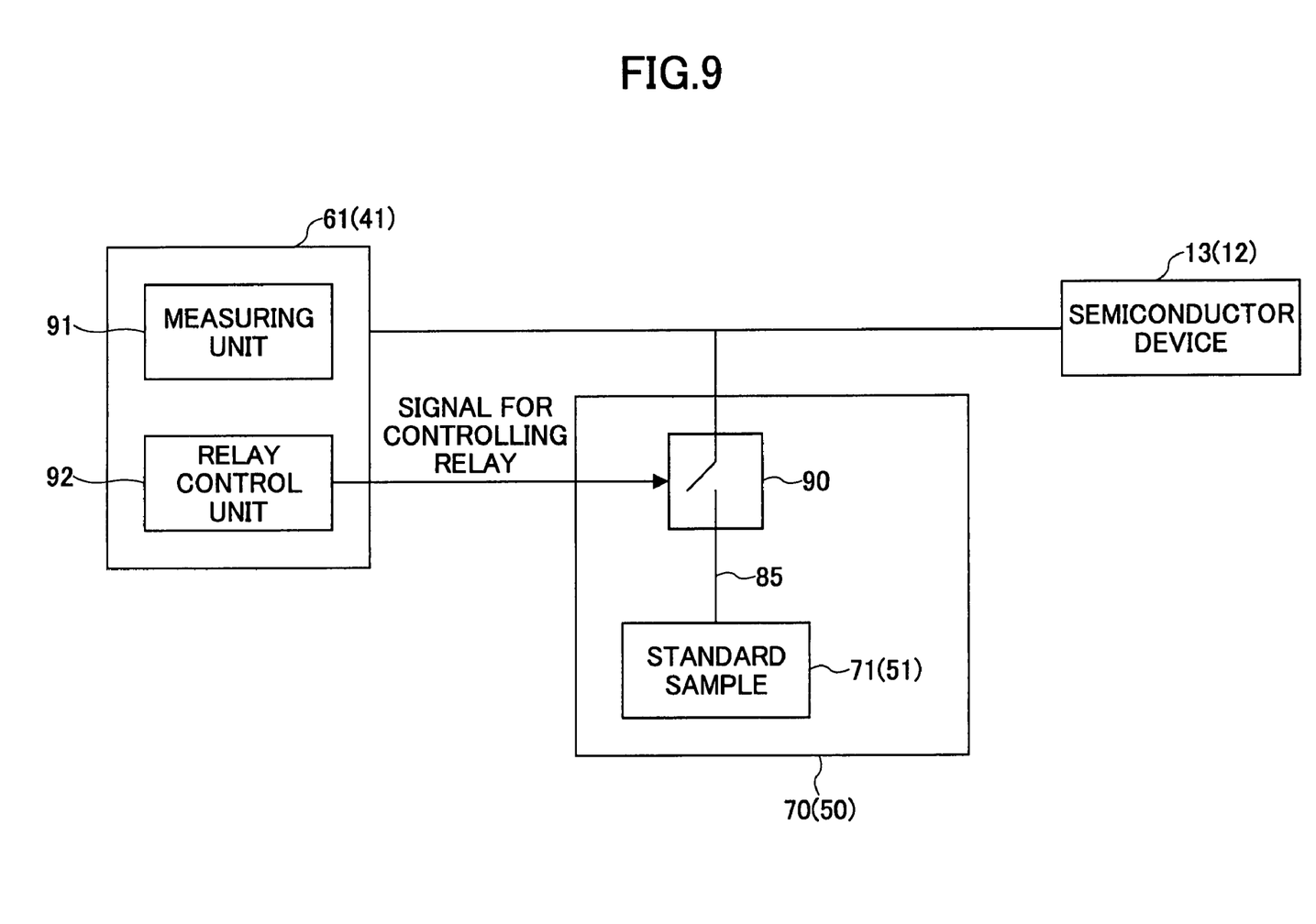
FIG. 9 is a block diagram showing a connection structure of a tester, the standard sample, a semiconductor device and a relay circuit.

The standard sample board 50 has the same structure as the standard sample board 70 shown in FIG. 8 and FIG. 9. Hence, explanation of the standard sample 50 is omitted in favor of using the explanation of the standard sample board 80 discussed with reference to FIG. 8 and FIG. 9.

Figure 5:
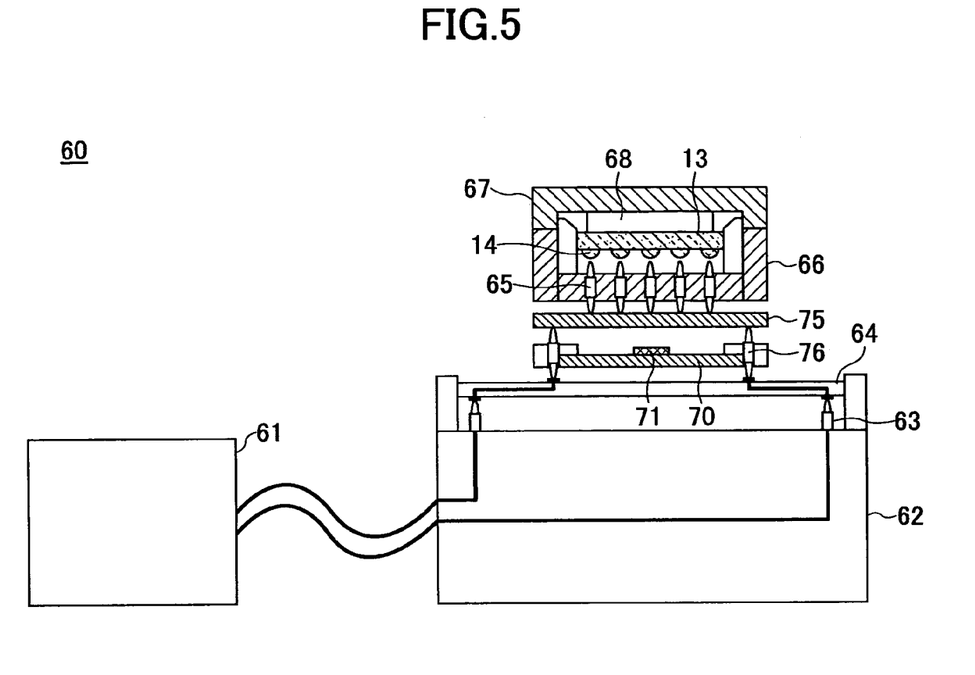
FIG. 5 is a schematic view showing a structure of an inspection device of an area type package semiconductor device, of an embodiment of the present invention.

FIG. 5 is a schematic view showing a structure of an inspection device of an area type package semiconductor device, of an embodiment of the present invention.

Referring to FIG. 5, an inspection device 60 for an area type package semiconductor device includes a tester 61, a test head 62, a printed circuit board 64, an IC socket main body part 66, an IC socket lid part 67, a standard sample board 70, and others.

The tester 61 works as a measuring part. The test head 62 is connected to the tester 61 via a wiring. The printed circuit board 64 is connected to the test head 62 via first pogo pins 63 in an upper part of the test head 62. The IC socket main body part 66 is connected to an upper surface of the relay board 75 via second pogo pins (socket pogo pins) 65. The IC socket lid part 67 is provided above the IC socket main body part 66 so as to cover the IC socket main body part 66. The standard sample board 70 is connected to the lower surface of the relay board 75 via third pogo pins (standard sample board pogo pins) 76.

A large number of connection terminals 14 formed on the lower surface of the area type package semiconductor device 13 are positioned in contact with the corresponding second pogo pins 65 provided in the IC socket main body 66. Under this structure, the semiconductor device 13 is supported from upper parts of the semiconductor device 13 by the semiconductor device supporting parts 68 of the IC socket lid part 67.

The standard sample 71, which is an element formed by dicing a semiconductor wafer, is mounted on the main surface of the standard sample board 70. The standard sample board 70 is provided between the IC socket main body 66 and the print circuit board 64. The IC socket main body part 66 containing the semiconductor device 13 and the standard sample board 70 on which the standard sample 71 is mounted are made to be unified.

The third pogo pins 76 are inserted into the standard sample board 70. Lower end of the third pogo pins 76 are connected to terminals provided on the printed circuit board 64.

In addition, the relay board 75 having a structure discussed below is provided between the IC socket main body 66 and the standard sample board 70. An upper surface of the relay board 75 is connected to the lower ends of the second pogo pins 65 and the lower surface of the relay board 75 is connected to the upper ends of the third pogo pins 76.

Under this structure, the semiconductor device 13 provided in the IC socket main body 66 can be electrically connected to the test head 62 by the second pogo pins 65, the relay board 75, the third pogo pins 76, the printed circuit board 64 and the first pogo pins 63. In addition, the semiconductor device 13 can be electrically connected to the tester 61 via the wiring, so that measuring can be performed by the tester 61.

In addition, the standard sample mounted on the main surface of the standard sample board 70 can be electrically connected to the test head 62 by the third pogo pins 76, the printed circuit board 64 and the first pogo pins 63. Furthermore, the standard sample 71 can be electrically connected to the tester 61 via the wiring, so that measuring can be performed by the tester 61.

Next, a connection structure of the IC socket main body part 66, the standard sample board 70, and the relay board 75 in the inspection device 60 of the area type package semiconductor device shown in FIG. 5 is discussed with reference to FIG. 6.

Figure 6:
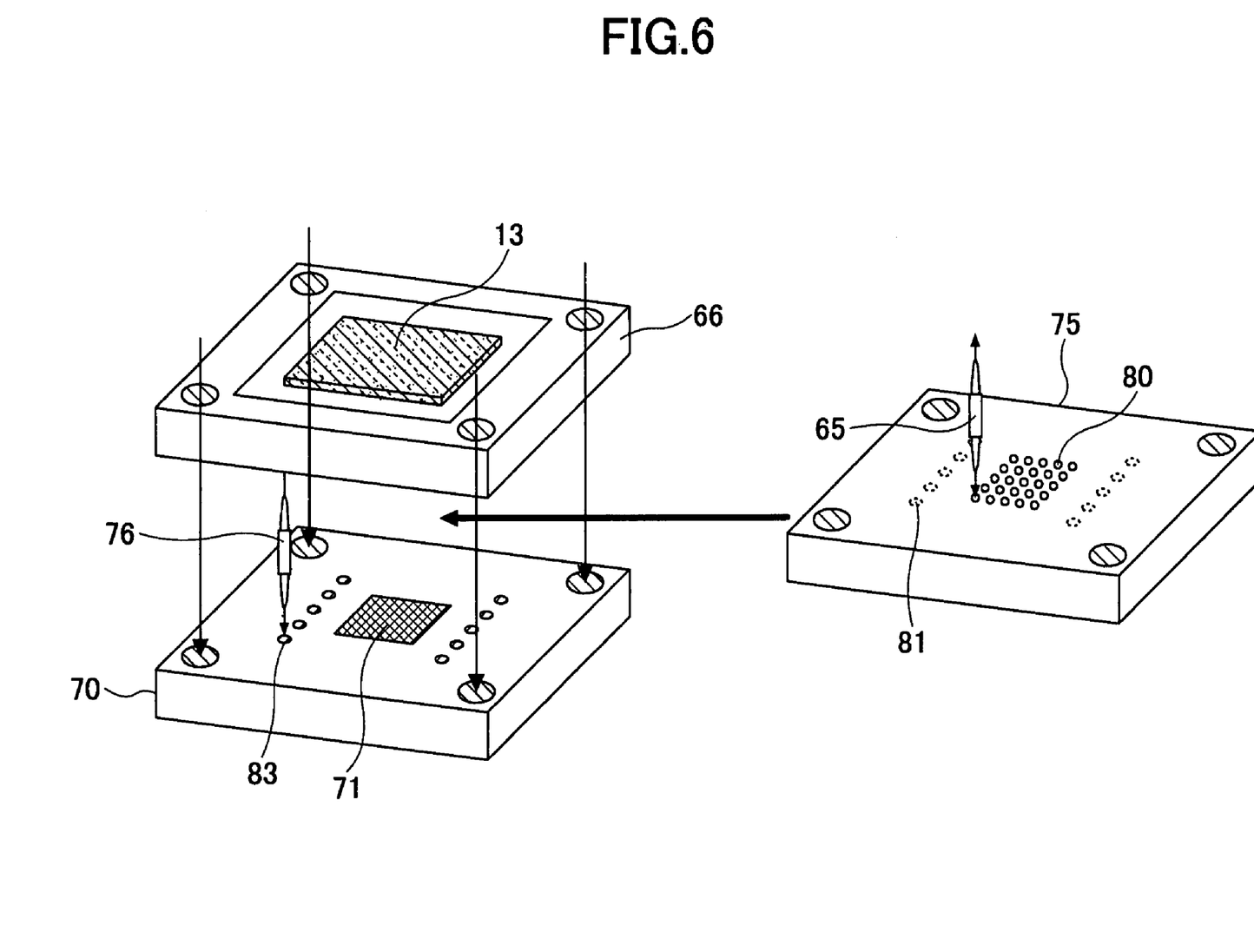
FIG. 6 is a perspective view showing a connection structure of an IC socket main body part, a standard sample board, and a relay board.

Here, FIG. 6 is a perspective view showing the connection structure of the IC socket main body part 66, the standard sample board 70, and the relay board 75.

Referring to FIG. 5 and FIG. 6, the relay board 75 is provided between the IC socket main body 66 in which the semiconductor device 13 is provide and the standard sample board 70 having a main surface where the standard sample 71 is mounted.

In FIG. 6, circular-shaped marks situated at four corners of main surfaces of the IC socket main body part 66, the standard sample board 70 and the relay board 75 are used for positioning the IC socket main body part 66, the standard sample board 70 and the relay board 75.

Contact pads 80 for contacting the second pogo pins (socket pogo pins) 65 are provided on the upper main surface of the relay board 75. The upper ends of the second pogo pins 65 come in contact with the corresponding connection terminals of the semiconductor device 13. The lower ends of the second pogo pins 65 come in contact with the contact pad 80.

Furthermore, as shown by dotted circles in FIG. 6, the contact pads 81 for the third pogo pins (standard sample board pogo pins) 76 are provided on the lower main surface of the relay board 75, so that the upper ends of the third pogo pins 76 come in contact with the contact pads 81.

Pad wirings not shown in FIG. 6 are provided inside of the relay board 75 so that the contact pads 80 for contacting the second pogo pins 65 and the contact pads 81 for contacting the third pogo pins 76 are wired.

The third pogo pins 76 are inserted into conductive piercing holes 83 formed in the standard sample board 70. As discussed above, the upper end of the third pogo pins 76 are connected to the contact pad 81 formed on the lower main surface of the relay board 75 and the lower ends of the third pogo pins 76 are connected to the printed circuit board 64 shown in FIG. 5.

Here, an inserting structure of the third pogo pins 76 into the standard sample board 70 is discussed with reference to FIG. 7.

Figure 7:
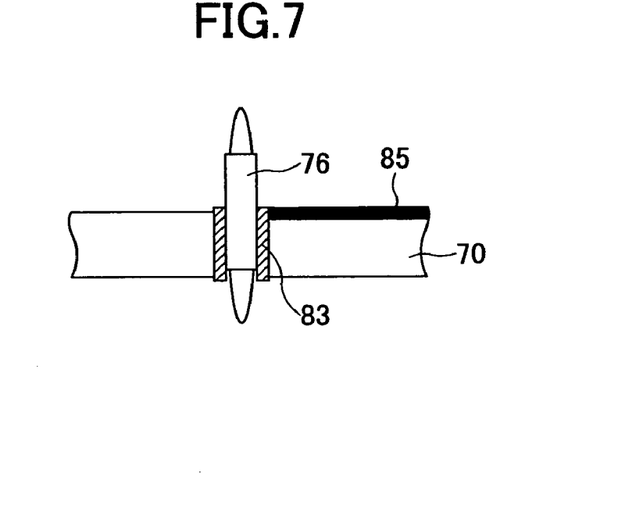
FIG. 7 is a cross-sectional view of a third pogo pin and the standard sample board for explaining an inserting structure of the third pogo pin into the standard sample board.

FIG. 7 is a cross-sectional view of one of the third pogo pins 76 and the standard sample board 70 for explaining the insertion of the third pogo pin 76 into the standard sample board 70.

Referring to FIG. 7, an upper part and a lower part of the third pogo pin 76 inserted into the standard sample board 70 project from the standard sample board 70. A pattern wiring 85 connected to the standard sample 71 is connected to a conductive piercing hole 83 where the third pogo pin 76 is inserted via a relay circuit 90 (See FIG. 8 and FIG. 9) discussed below.

The printed circuit board 64 and the standard sample 71 are electrically connected via the pattern wiring 85 connected to the conductive piercing hole 83 and the standard sample 71, by inserting the third pogo pin 76, which connects to the semiconductor device 13 via the relay board 75 and the second pogo pin 65, into the conductive piercing hole 83 formed in the standard sample board 70.

Next, a wiring structure having a relay circuit is discussed with reference to FIG. 8 and FIG. 9.

Here, FIG. 8 is a plan view of the standard sample board 70. FIG. 9 is a block diagram showing a connection structure of a tester 61, the standard sample 71, a semiconductor device 13 and a relay circuit 90.

Referring to FIG. 8, the relay circuit 90 is provided on the pattern wiring 85 connecting the standard sample 71 and the conductive piercing hole 83 where the third pogo pin 76 is inserted. For the convenience of explanation, illustrations of the pattern wiring 85 and the relay circuit 90 are omitted in FIG. 6.

As shown in FIG. 9, the relay circuit 90 connects or disconnects the tester 61 that includes a measuring unit 91 and the standard sample 71.

In other words, in a case where the semiconductor device 13 shown in FIG. 5 is not installed in the inspection device 60, a signal for turning on the relay is sent to the relay circuit 90 from a relay control unit 92 provided in the tester 61 so that the relay is turned on. As a result of this, the standard sample 71 and the tester 61 are connected via the pattern wiring 85.

On the other hand, in a case where the semiconductor device 13 is installed in the inspection device 60 so as to be measured, a signal for turning off the relay is sent to the relay circuit 90 from the relay control unit 92 so that the relay is turned off. As a result of this, the measuring unit 91 of the tester 61 is connected to only the semiconductor device 13 and not connected to the standard sample 51. Hence, it is possible to prevent bad influence from the standard sample 51 at the time of measuring.

Thus, in the inspection device 60 of the area type package semiconductor device of the embodiment of the present invention, the standard sample substrate 70 having the main surface on which the standard sample 71 is mounted is provided between the IC socket main body 66 and the printed circuit board 64. In addition, the standard sample board 70 and the IC socket main body 66 where the semiconductor device 13 is installed are unified.

Furthermore, the relay board 75 connecting the IC socket main body part 66 and the standard sample board 70 via the second pogo pin 65 and the third pogo pins 76 is provided between the IC socket main body part 66 where the semiconductor device 13 is installed and the standard sample substrate 70 having the main surface on which the standard sample 71 is mounted. Therefore, it is possible to easily correspond to various kinds of package type semiconductor devices by changing the pad wiring provided inside of the relay board 75, the pad wiring connecting the contact pad 80 for the second pogo pins 65 and the contact pad 81 for the third pogo pins 76.

Furthermore, the relay circuit 90 connecting or disconnecting the tester 61 and the standard sample 71 is provided in the standard sample board 70. In a case where the semiconductor device 13 is measured by the inspection device 60, the relay circuit 90 is turned off so as to cut off the connection with the standard sample 91. The measuring unit 91 of the tester 61 is connected to only the semiconductor device 13 and not connected to the standard sample 51. Hence, it is possible to prevent bad influence from the standard sample 51 at the time of measuring.

As discussed above, the above-mentioned relay circuit 90 is provided in the standard sample board 50 of the inspection device 40 of the flat type package semiconductor device shown in FIG. 4.

Figure 10:
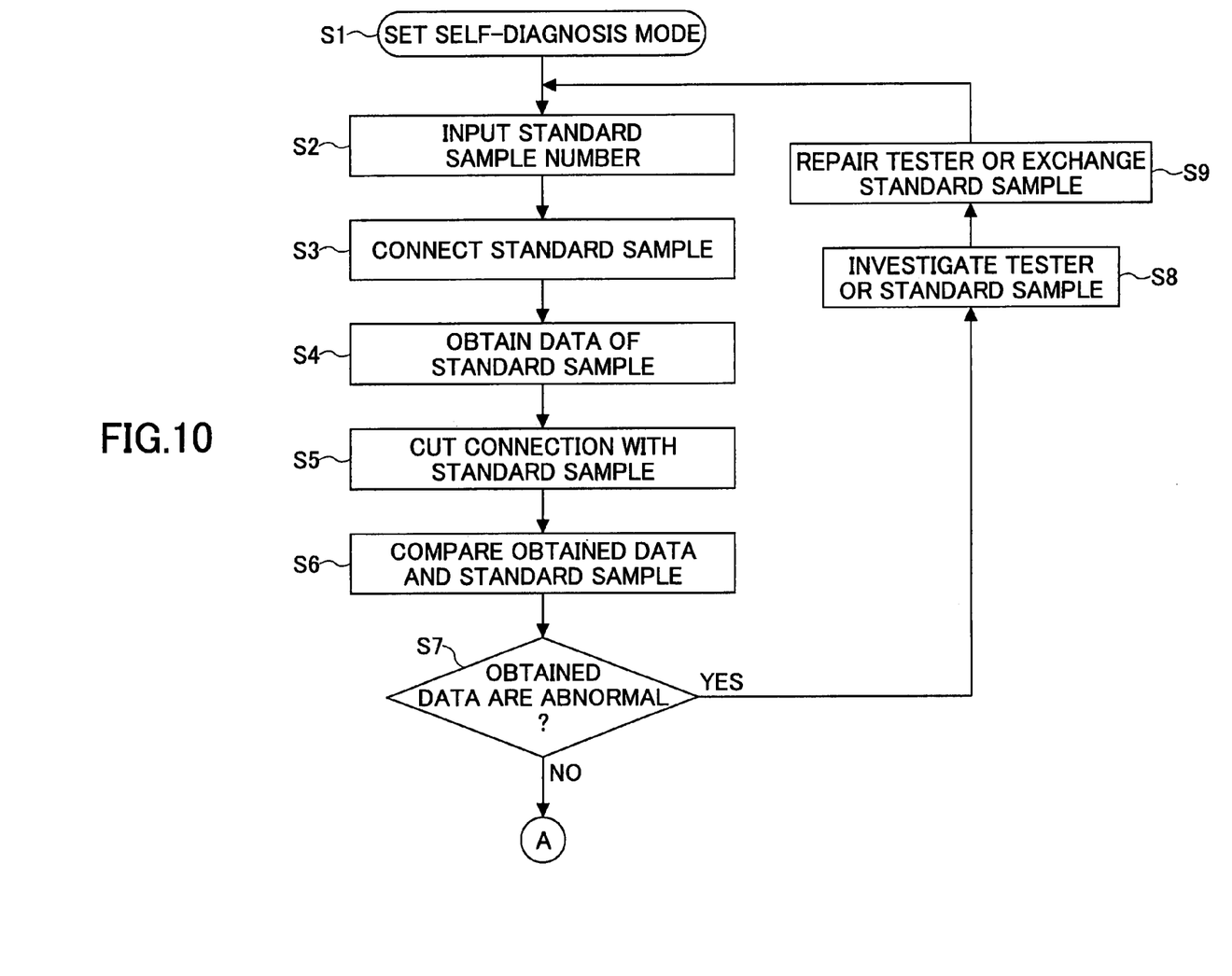
FIG. 10 is a first flowchart for explaining an inspection method of the semiconductor device.
Figure 11:
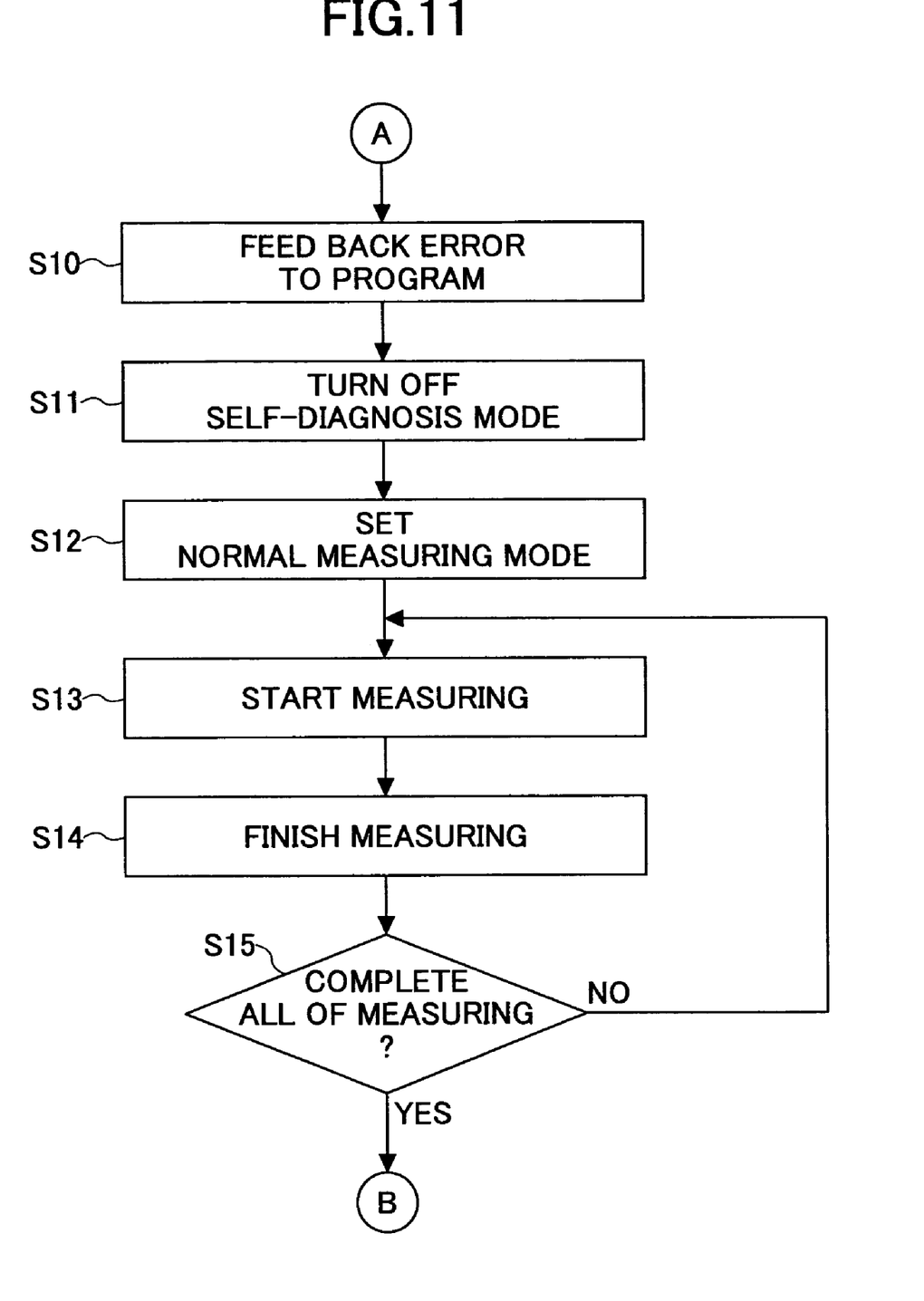
FIG. 11 is a second flowchart for explaining an inspection method of the semiconductor device.
Figure 12:
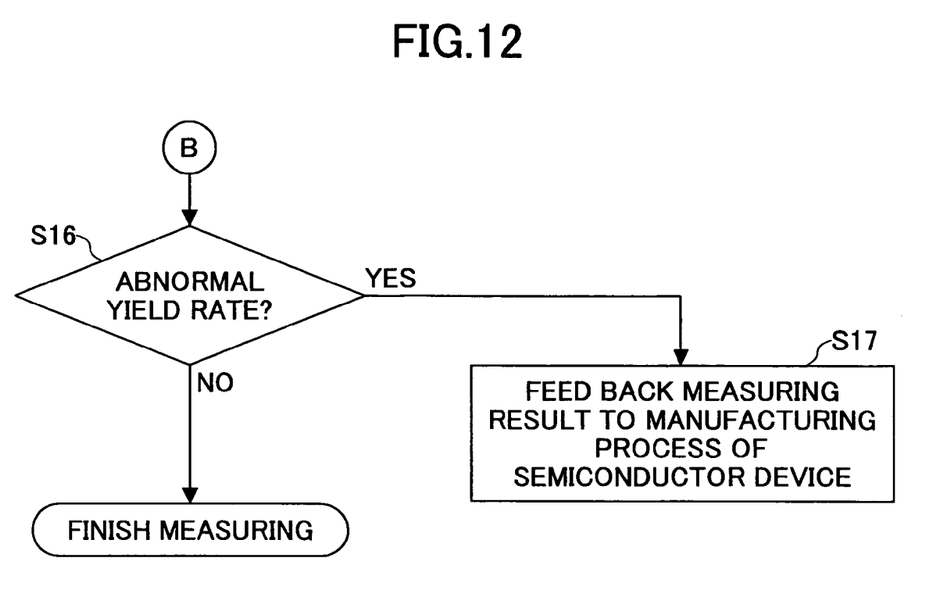
FIG. 12 is a third flowchart for explaining an inspection method of the semiconductor device.

Next, an inspection method of the semiconductor device 11 or 13 by using the inspection device 40 of the flat type package semiconductor device or the inspection device 60 of the area type package semiconductor device is discussed with reference to FIG. 10 through FIG. 12. Here, FIG. 10 through FIG. 12 are first through third flowcharts for explaining an inspection method of the semiconductor device.

The inspection of the semiconductor device 11 or 13 is made by implementing an inspection program installed in the measuring unit 91 of the tester 61.

In step 1, the inspection program is set to a self-diagnosis mode. Processes in step 2 through step 10 are implemented by this self-diagnosis mode.

Next, a number of the standard sample 51 or 71 mounted on the standard sample board 50 or 70 mounted on the inspection device 40 or 60 is input in step 2. As a result of this, a signal for turning on the relay is sent to the relay circuit 90 from the relay control unit 92 provided in the tester 41 or 61 so that the relay is turned on.

As a result of this, the standard sample 51 or 71 and the tester 41 or 61 are connected via the pattern wiring 85 in step 3.

By this connection, the standard sample 51 or 71 is measured by the measuring unit 91 of the tester 41 or 61 so that data of the standard sample 51 or 71 are obtained in step 4.

Next, a signal for turning off the relay is sent to the relay circuit 90 from the relay control unit 92 provided in the tester 41 or 61 so that the relay is turned off.

The connection between the standard sample 51 or 71 and the tester 41 or 61 is cut off via the pattern wiring 85 in step 5.

The data of the standard sample 51 or 71 obtained in step 4 and the data of the standard sample written and stored in the inspection program in advance are compared in step 6.

Based on the result of the comparison, whether there is abnormality of the data of the standard sample 51 or 71 obtained in step 4 is determined in step 7.

In a case where it is determined that there is abnormality of the data of the standard sample 51 or 71 obtained in step 4 in step 7 such that the difference between the voltage measured by measuring the standard sample 51 or 71 and a designated voltage standard value is beyond an acceptable range, an abnormality may exist in the tester 41 or 61 or the standard sample 51 or 71 and therefore, the reason for the abnormality is investigated in step 8. The tester 41 or 61 is repaired or the standard sample 51 or 71 is exchanged in step 9, and then the process returns to step 2.

The determination of whether the abnormality exists in the tester 41 or 61 or the abnormality exists in the standard sample 51 or 71 is made by, for example, confirmation of the result of the implementation of the system re-diagnosis for the tester 41 or 61 or confirmation of error input of the number of the standard sample in step 2 for the standard sample 51 or 71.

Thus, by comparing the data of the standard sample 51 or 71 obtained in step 4 and the data of the standard sample written and stored in the inspection program in advance, it is possible to securely determine whether the abnormality exists in the tester 41 or 61 or the standard sample 51 or 71 in a short period of time.

In a case where it is determined in step 7 that there is no abnormality of the data of the standard sample 51 or 71 obtained in step 4 such that the difference between the voltage measured by measuring the standard sample 51 or 71 and a designated voltage standard value is in the acceptable range, the difference between the data of the standard sample 51 or 71 obtained in step 4 and the data standard value of the standard sample written and stored in advance in the inspection program is fed back to the inspection program as an error of the tester 41 or 61 in step 10.

By feeding back the error to the inspection program and correcting the error, it is possible to inspect the semiconductor device 11 or 13 more securely.

Next, the self-diagnosis mode of the inspection program is turned off in step 11 and the inspection program is set to a normal measuring mode in step 12 so that the semiconductor device 11 or 13 is measured in step 13.

Conventionally, if it is found that there is no abnormality, the standard sample is exchanged for a semiconductor device that is an actual subject to be inspected so that the inspection or test of the semiconductor device is started. On the other hand, in this embodiment, such an operation can be easily conducted by just turning off the self-diagnosis mode. The processes in steps 13 through 15 are implemented by the normal measuring mode.

After the measuring of the semiconductor device 11 or 13 is finished in step 14, whether the measuring of all of the semiconductor devices 11 or 13 being the objects to be measured is finished is determined in step 15.

In a case where it is determined in step 15 that the measuring of all of the semiconductor devices 11 or 13 being the objects to be measured is not finished, the process goes back to the step 13.

In a case where it is determined in step 15 that the measuring of all of the semiconductor devices 11 or 13 being the objects to be measured is finished, whether the measuring result indicates an abnormal yield (success rate) is determined in step 16. If an abnormal yield is not indicated in step 16, the measuring is finished.

On the other hand, if the abnormal yield exceeds a designated yield standard such that, for example, 200 semiconductor devices among a tested 1000 semiconductor devices 11 or 13 indicate abnormality in step 16, since it is already determined in the self-diagnosis mode that the tester 41 or 61 normally works, it is determined that a measured property of the tested abnormal semiconductor devices 11 or 13 is bad. For improving such a property, the measuring result is fed back in step 17 to a manufacturing process of the semiconductor device which process is performed prior to the inspection process of the semiconductor device 11 or 13.

In order to exchange the standard sample 51 or 71, the standard sample board 70 on the main surface of which the standard sample 51 or 71 is mounted can be provided detachably from the inspection device 40 or 60.

Under this structure, interrelated data between different printed circuit boards 44 or 64 or between different testers 41 or 61 can be easily confirmed.

As discussed above, when the standard sample is tested and if there is no abnormality, the standard sample is exchanged for the semiconductor device being an actual subject to be inspected so that the semiconductor device is tested. On the other hand, in the inspection device of this embodiment, the IC socket main body part containing the semiconductor device and the standard sample board holding the standard sample are unified. Therefore, in this embodiment, such an exchange required in the related art is not necessary and can be made by an easy operation, namely turning off the self-diagnosis mode.

In addition, because of this structure, a process from diagnosis of the tester or the like based on the measurement of the standard sample to the inspection of the semiconductor device can be made short and easy.

Conventional structures of the IC socket main body part or the printed circuit board can be used in this embodiment of the present invention.

Furthermore, in the inspection device of this embodiment, the difference between the data of the standard sample obtained by measuring the standard sample and the data standard value of the standard sample written and stored in advance in the inspection program is fed back to the inspection program as an error of the tester so as to be corrected. Therefore, it is possible to inspect the semiconductor device more securely.

In addition, in the inspection device of this embodiment, the standard sample board on which the standard sample is mounted can be detachably provided. Because of this, it is possible to exchange the standard sample and easily confirm the interrelated data between different printed circuit boards or between different testers. Furthermore, even if the property of the semiconductor device is changed, it is possible to easily correspond to this by exchanging the standard sample.

The present invention is not limited to these embodiments, but variations and modifications may be made without departing from the scope of the present invention.

This patent application is based on Japanese Priority Patent Application No. 2006-14229 filed on Jan. 23, 2006, the entire contents of which are hereby incorporated by reference.

What is claimed is:

1. An inspection device of a semiconductor device, comprising:
    a socket where the semiconductor device is installed;
    a measuring part configured to inspect an electrical property of the semiconductor device; and
    a standard sample board where a standard sample is mounted;
    wherein
        the standard sample and the socket are provided in a body,
        a standard value of the standard sample is stored in the measuring part,
        the standard sample board and the socket are unified,
        the standard sample board is electrically connected to the measuring part,
        the standard sample board includes a relay circuit configured to electrically connect or disconnect the measuring part and the standard sample, and
        whether there is abnormality of the measuring part is determined by comparing a value of the standard sample measured by the measuring part and the standard value.

2. The inspection device of the semiconductor device as claimed in claim 1,
    wherein if relay of the relay circuit is turned on, the measuring part and the standard sample are electrically connected; and
    if the relay of the relay circuit is turned off, the measuring part and the standard sample are electrically disconnected so that the measuring part is electrically connected to the semiconductor device.

3. The inspection device of the semiconductor device as claimed in claim 1,
    wherein the standard sample board is detachably installed in the inspection device.

4. The inspection device of the semiconductor device as claimed in claim 1,
    wherein the value of the standard sample measured by the measuring part and the standard value of the standard sample stored in the measuring part are compared by implementing an inspection program provided in the measuring part.

5. The inspection device of the semiconductor device as claimed in claim 4,
    wherein if it is determined that there is no abnormality in the measuring part based on the comparison, a difference between the measured value of the standard sample and the standard value of the standard sample written in the inspection program is fed back to the inspection program as an error of the measuring part.

6. An inspection device of a semiconductor device, comprising:
    a socket where the semiconductor device is installed;
    a measuring part configured to inspect an electrical property of the semiconductor device; and
    a standard sample board where a standard sample is mounted;
    wherein the standard sample and the socket are provided in a body, a standard value of the standard sample is stored in the measuring part, the standard sample board and the socket are unified, whether there is abnormality of the measuring part is determined by comparing a value of the standard sample measured by the measuring part and the standard value, and a relay board, the relay board being configured to electrically connect the semiconductor device and the standard sample, is provided between the socket where the semiconductor device is provided and the standard sample board.

7. The inspection device of the semiconductor device as claimed in claim 6, wherein the relay board and the semiconductor device are connected by a socket pogo pin.

8. The inspection device of the semiconductor device as claimed in claim 7, wherein the relay board and the standard sample board are connected by a standard sample board pogo pin, the standard sample board pogo pin being inserted in the standard sample board, and the standard sample board pogo pin and the standard sample are connected by a pattern wiring formed in the standard sample board.

9. The inspection device of the semiconductor device as claimed in claim 8, wherein the socket pogo pin connecting the relay board and the semiconductor device and the standard sample board pogo pin connecting the relay board and the standard sample board are electrically connected by pad wiring provided in the relay board.

* * * * *